United States Patent
Takai et al.

[11] Patent Number: 5,972,435
[45] Date of Patent: Oct. 26, 1999

[54] METHOD FOR FORMING FILM BY PLASMA POLYMERIZATION AND APPARATUS FOR FORMING FILM BY PLASMA POLYMERIZATION

[75] Inventors: Mitsuru Takai, Nagano-ken; Shinji Miyazaki, Saku; Kunihiro Ueda, Saku; Hiromichi Kanazawa, Saku, all of Japan

[73] Assignee: TDK Corporation, Tokyo, Japan

[21] Appl. No.: 09/125,744

[22] PCT Filed: Dec. 26, 1997

[86] PCT No.: PCT/JP97/04866

§ 371 Date: Aug. 24, 1998

§ 102(e) Date: Aug. 24, 1998

[87] PCT Pub. No.: WO98/29578

PCT Pub. Date: Jul. 9, 1998

[30] Foreign Application Priority Data

Dec. 27, 1996 [JP] Japan .................................. 8/357609

[51] Int. Cl.$^6$ ....................................................... C08F 2/46
[52] U.S. Cl. ...................... 427/488; 118/50; 118/723 E; 118/730; 427/131; 427/132; 427/255.5; 427/294; 427/569
[58] Field of Search ..................... 427/488, 569, 427/255.5, 294, 131, 132; 118/723 E, 730, 50

[56] References Cited

FOREIGN PATENT DOCUMENTS

| 61-5435 | 1/1986 | Japan . |
| 61-216123 | 9/1986 | Japan . |
| 1-320625 | 12/1989 | Japan . |
| 2-15171 | 1/1990 | Japan . |
| 5-135351 | 6/1993 | Japan . |
| 7-169046 | 7/1995 | Japan . |

*Primary Examiner*—Bernard Pianalto
*Attorney, Agent, or Firm*—Oblon, Spivak, McClelland, Maier & Neustadt, P.C.

[57] ABSTRACT

The present invention manifests a highly excellent effect of allowing the plasma polymerization film to be formed stably for a long time while very rarely suffering occurrence of abnormal discharge during the formation of the plasma polymerization film and promoting the improvement of the yield of products because it adopts as the electrode for implementing plasma polymerization that of the electrodes which is located on the side confronting a surface on which the plasma polymerization film is formed, coats this electrode with a polymer material at a covering ratio in the range of 50–100%, and effects the formation of the plasma polymerization film on an elongate substrate under the operating pressure in the range of $10^{-3}$–1 Torr. Further, the properties of the plasma polymerization film also become highly excellent.

7 Claims, 5 Drawing Sheets

METHOD FOR FORMING FILM BY PLASMA POLYMERIZATION AND APPARATUS FOR FORMING FILM BY PLASMA POLYMERIZATION

TECHNICAL FIELD

The present invention relates to a plasma polymerization film forming method and a plasma polymerization film forming apparatus and, in particular, to a plasma polymerization film forming method and a plasma polymerization film forming apparatus suitable for, for example, the formation of a plasma polymerization film as a surface protective film of a magnetic recording medium having a ferromagnetic metal thin film, like the so-called vacuum deposition tape, formed by the oblique vacuum deposition technique or vertical vacuum deposition technique. More particularly, the present invention relates to a plasma polymerization film forming method and a plasma polymerization film forming apparatus which allow a plasma polymerization film to be stably produced for a long time without entraining generation of abnormal discharge during the formation of the plasma polymerization film and impart excellent film properties to the formed film.

BACKGROUND ART

The so-called metal thin film type magnetic recording medium which has a ferromagnetic metal thin film of metal or Co—Cr alloy formed on a substrate by a vacuum thin film forming technique, such as vacuum deposition, sputtering or ion plating, is endowed with many advantages shown below as compared with the so-called coating type magnetic recording medium which uses magnetic powder and binder.

Specifically, the metal thin film type magnetic recording medium enjoys various advantages such as permitting recording of high density owing to excellent coercive force and high packing density of magnetic material, manifesting a highly favorable electromagnetic conversion property, allowing a notable decrease in the thickness of the magnetic layer, and markedly repressing the loss of thickness during the course of reproduction.

The metal thin film type magnetic recording medium of this nature, however, is generally at a disadvantage in readily sustaining corrosion in the magnetic layer (ferromagnetic metal thin film) thereof and is further at a disadvantage in being deficient in running property and durability.

For eliminating these problems, various attempts have been heretofore made to form a protective film on the ferromagnetic metal thin film. The plasma polymerization film constitutes itself an apt example of such protective film. In the formation of this plasma polymerization film, the feed gas, electric power, surface area of the electrode, etc. must be properly controlled for ensuring impartation of necessary quality to the produced film. As the pertinent prior art, a proposal has been made to the effect that the value of $W/(F \times S)$, wherein F represents the flow rate of the monomer gas as a feed gas (cc/sec), W the applied electric power (watt), and S the surface area of the electrode ($cm^2$), is controlled in the range of 5–10(JP-A-61-5435).

The inventors of the present application, as a result of their diligent study on the conditions for the formation of a film by plasma polymerization, have discovered that in the range of the conditions for the plasma polymerization according to the proposal mentioned above, the applied voltage is so large relative to the value of (area of electrode x amount of feed monomer gas) as to entail such problems as frequent occurrences of abnormal discharge and degradation of yield of production or render difficult the operation of an actual production line.

The present invention has been made under such circumstances and has an object to provide a plasma polymerization film forming method and a plasma polymerization film forming apparatus which enjoy advantages such as repressing the occurrence of abnormal discharge to the minimum, permitting the plasma polymerization film to be stably formed for a long time, and promoting the improvement in the yield of production, let alone imparting excellent film properties including durability to the produced plasma polymerization film.

DISCLOSURE OF THE INVENTION

The inventors of the present application, after making a diligent study on the conditions for the formation of a film by plasma polymerization and on the construction of a plasma electrode employed for the plasma polymerization with a view to fulfilling the object mentioned above, have discovered that the plasma polymerization film can be produced in a state sparingly suffering the occurrence of abnormal discharge stably for a long time (and further that the formed film excels in such film properties as durability) by coating the plasma electrode with a specific material at a specific ratio. The present invention has been reached as a result.

Specifically, the present invention is directed to a plasma polymerization film forming method for forming a plasma polymerization film on an elongate substrate in the form of a film while continuously conveying the elongate substrate, which method comprises using an electrode for implementing plasma polymerization as one of electrodes which is located on the side confronting a surface on which the plasma polymerization film is formed, and is coated with a polymer material at a covering ratio in the range of 50–100%; and introducing a feed gas and meanwhile applying voltage to the coated electrode, and forming the plasma polymerization film on the elongate substrate under an operating pressure in the range of $10^{-3}$–1 Torr.

In a preferred manner, the elongate substrate is a laminated tape having a ferromagnetic metal thin film formed on a nonmagnetic substrate, and the plasma polymerization film is formed on the ferromagnetic metal thin film.

In a preferred manner, the plasma polymerization film is formed on the ferromagnetic metal thin film while continuously conveying the laminated tape having the ferromagnetic metal thin film formed on the nonmagnetic substrate, in a state where the reverse surface side of the nonmagnetic substrate is in contact with at least a part of a rotary drum.

In a preferred manner, the feed gas is a hydrocarbon monomer gas.

In a preferred manner, the plasma voltage during the formation of the plasma film is in the range of 300–1000 V.

The present invention is further directed to a plasma polymerization film forming apparatus for forming a plasma polymerization film on an elongate substrate in the form of a film while continuously conveying the elongate substrate, which apparatus comprises an electrode, as an electrode for implementing plasma polymerization, which is located on the side confronting a surface on which the plasma polymerization film is formed, wherein the electrode is coated on a surface thereof on the confronting side with a polymer material at a covering ratio in the range of 50–100%.

In a preferred manner, a plasma treatment object is a laminated tape having a ferromagnetic metal thin film formed on a nonmagnetic substrate, a rotary drum is provided for continuous conveyance while being in contact with the reverse surface side of the nonmagnetic substrate, and the electrode coated with the polymer material is arranged so as to confront the rotary drum.

The present invention achieves the effect of increasing the plasma voltage generated between the electrodes (the effective voltage applied to the plasma electrode) without altering the power source voltage, by coating the plasma electrode with a specific material at a specific ratio. As a result, since the plasma voltage can be increased without forcibly raising the power source voltage, the generation of abnormal discharge during the process of production can be suppressed.

BEST MODE FOR CARRYING OUT THE INVENTION

Hereinbelow, an embodiment of the present invention will be described in detail.

As one example of a plasma polymerization film forming method according to the present invention, a method of producing a magnetic recording medium will be described hereinbelow. First, one example of a plasma polymerization film forming apparatus which is used in the method of producing the magnetic recording medium will be described with reference to FIG. 1.

Figure 1:
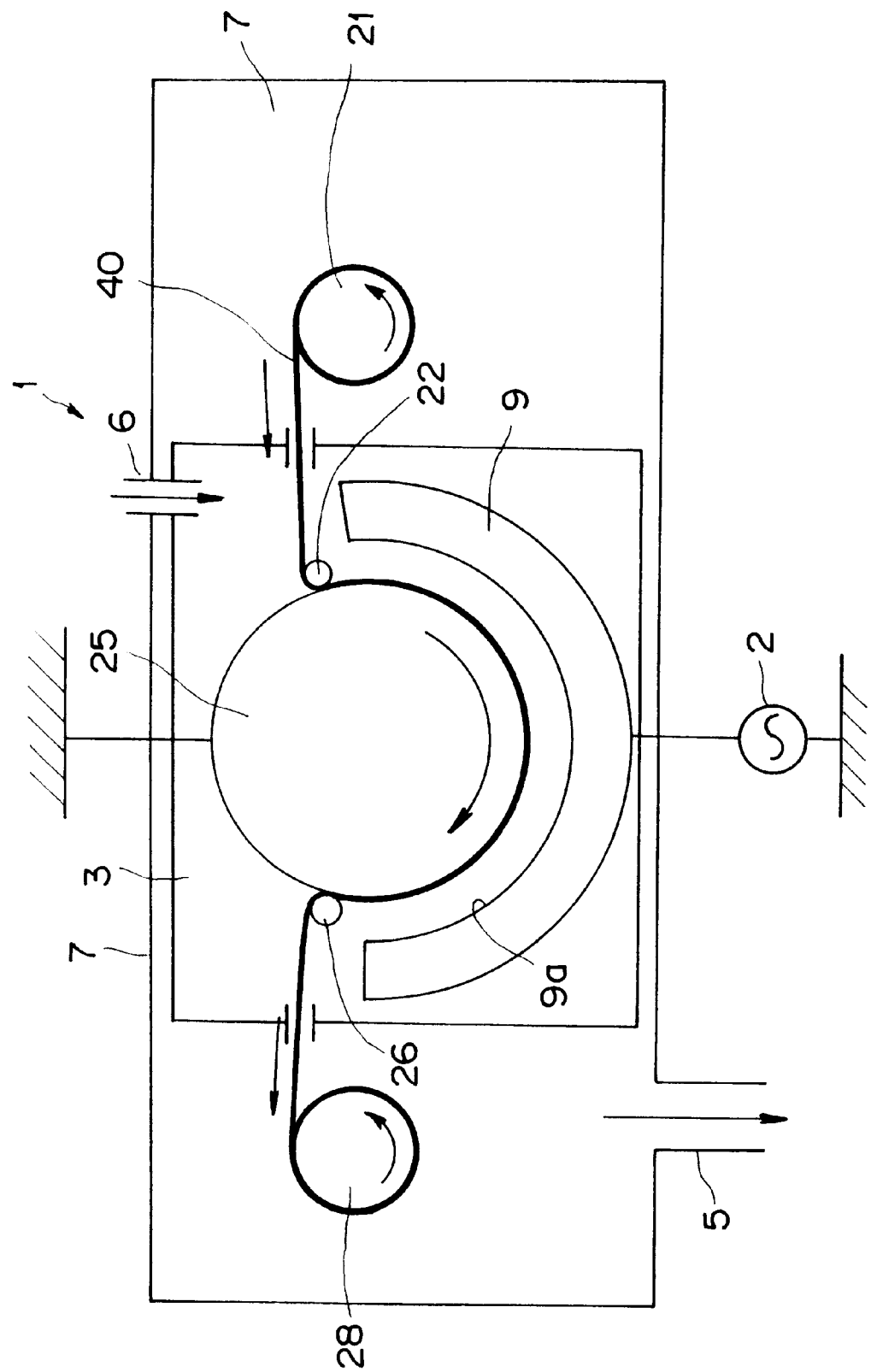
FIG. 1 is a schematic front view illustrating one example of a plasma polymerization film forming apparatus to be used in the present invention.
Figure 4:
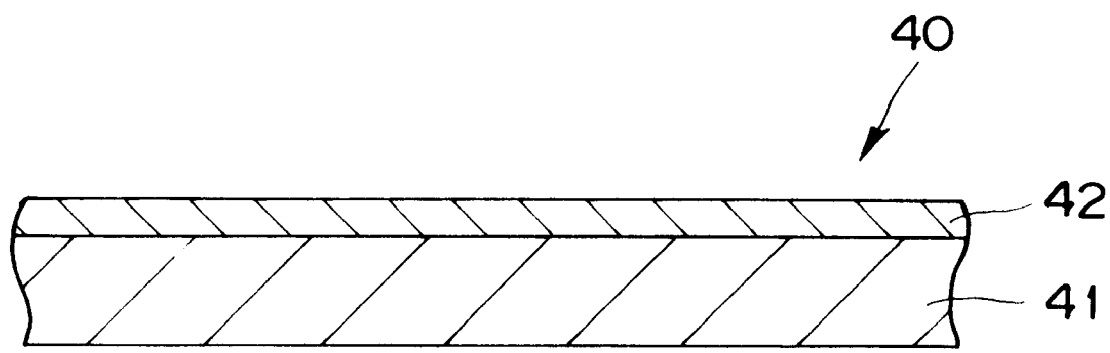
FIG. 4 is a sectional view illustrating the laminated structure of a laminated tape.

FIG. 1 is a front view schematically illustrating a plasma polymerization film forming apparatus 1. On an unwinding roll 21 which is arranged in an outer vacuum cell 7, a laminated tape 40 having a ferromagnetic metal thin film superposed in advance on a nonmagnetic substrate is wound. The state of laminated cross section of the laminated tape 40 is illustrated in FIG. 4. In FIG. 4, reference numeral 41 represents the nonmagnetic substrate and reference numeral 42 represents the ferromagnetic metal thin film. As illustrated in FIG. 1, the laminated tape 40 which has been unwound from the unwinding roll 21 is guided into a reaction chamber 3, moved along a rotary drum 25 (otherwise called a cooling drum) via a guide roll 22 arranged in the reaction chamber 3, further led out of the reaction chamber 3 via a guide roll 26, and finally rewound on a rewinding roll 28. In this case, the rotary drum 25 is held in contact with the reverse surface side (the side on which the ferromagnetic metal thin film is not formed) of the nonmagnetic substrate.

In the reaction chamber 3, a plasma electrode 9 for generating discharge for the formation of a plasma polymerization film is disposed concentrically around (below in the figure) the foregoing rotary drum 25. A high frequency power source 2 for the generation of plasma, for example, is connected to the plasma electrode 9 and utilized for applying voltage thereto. In the case of the apparatus illustrated in FIG. 1, the rotary drum 25 constitutes one of plasma electrodes (on the grounding side) where no discharge is generated.

In the outer vacuum cell 7, an exhaust pipe is arranged. Through the exhaust pipe (normally having a vacuum pump connected thereto), the interior of the outer vacuum cell 7 (and the reaction chamber 3) is decompressed. On the other hand, a monomer gas or a mixed gas of the monomer gas with a carrier gas is introduced as a feed gas via an inlet pipe 6 into the reaction chamber 3.

The plasma electrode 9 is an electrode for carrying out plasma polymerization and is disposed on the side confronting the surface of a medium on which a plasma polymerization film is formed. The plasma electrode 9 is in the shape of a curved plate as illustrated in the drawing and is so disposed as to enclose concentrically the approximately lower half of the foregoing rotary drum 25. Further, the plasma electrode 9 has a surface 9a coated with a polymer material at a covering ratio in the range of 50–100%, preferably 60–100%, and more preferably 70–100%. If the covering ratio is less than 50%, abnormal discharge is generated so often in the reaction chamber 3 that a plasma polymerization film can not be formed stably for a long time. The yield of products is lowered as well.

With respect to the manner of coating the surface 9a of the plasma electrode 9, excluding the case of a covering ratio 100%, it is preferable that the coat covers the entire surface of the electrode substantially uniformly in a finely dispersed state (or, in a different aspect, it is preferable that the uncovered part of the electrode is finely dispersed). Specifically, a zigzag array of such circular segments of a coat (circular pieces punched out of one sheet as arrayed in a zigzag pattern) as illustrated in FIG. 2, a zigzag array of such square segments of a coat (square pieces punched out of one sheet as arrayed in a zigzag pattern) as illustrated in FIG. 3, or arrays obtained by reversing them may be cited, which, however, is not limited to those shapes.

As preferred concrete examples of the polymer material for the coating, such resins as fluorine-containing resins, polyamide, polycarbonate, polyacetal, polyimide, polyether ether ketone, polyphenylene sulfide, polybenzimidazole, polyethylene, polyvinyl chloride, polystyrene, polypropylene, methacryl resin, petroleum resin, polyvinylidene chloride, polycycloolefin, phenol resin, urea resin, (un)saturated polyester, polyurethane, alkyd resin, melamine resin, epoxy resin, ABS resin, BS resin, and AS resin and plasma polymers of organic compounds may be cited. Among them, the fluorine-containing resins, methacryl resin, polyester, polyurethane, epoxy resin, and plasma polymers of organic compounds may be particularly cited.

Figure 2:
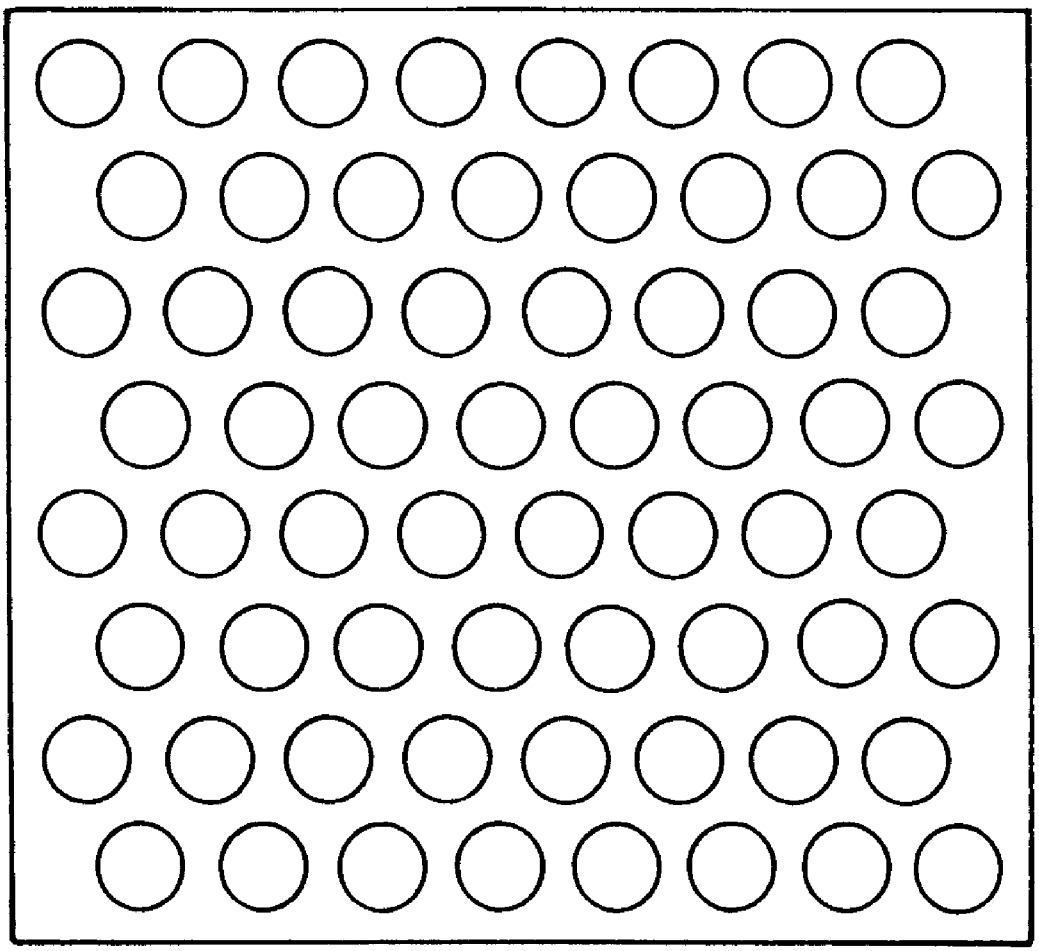
FIG. 2 is a diagram illustrating a plasma electrode on the side confronting the surface of a medium on which a plasma polymerization film is formed, as a model for the manner of coating the surface of the electrode.
Figure 3:
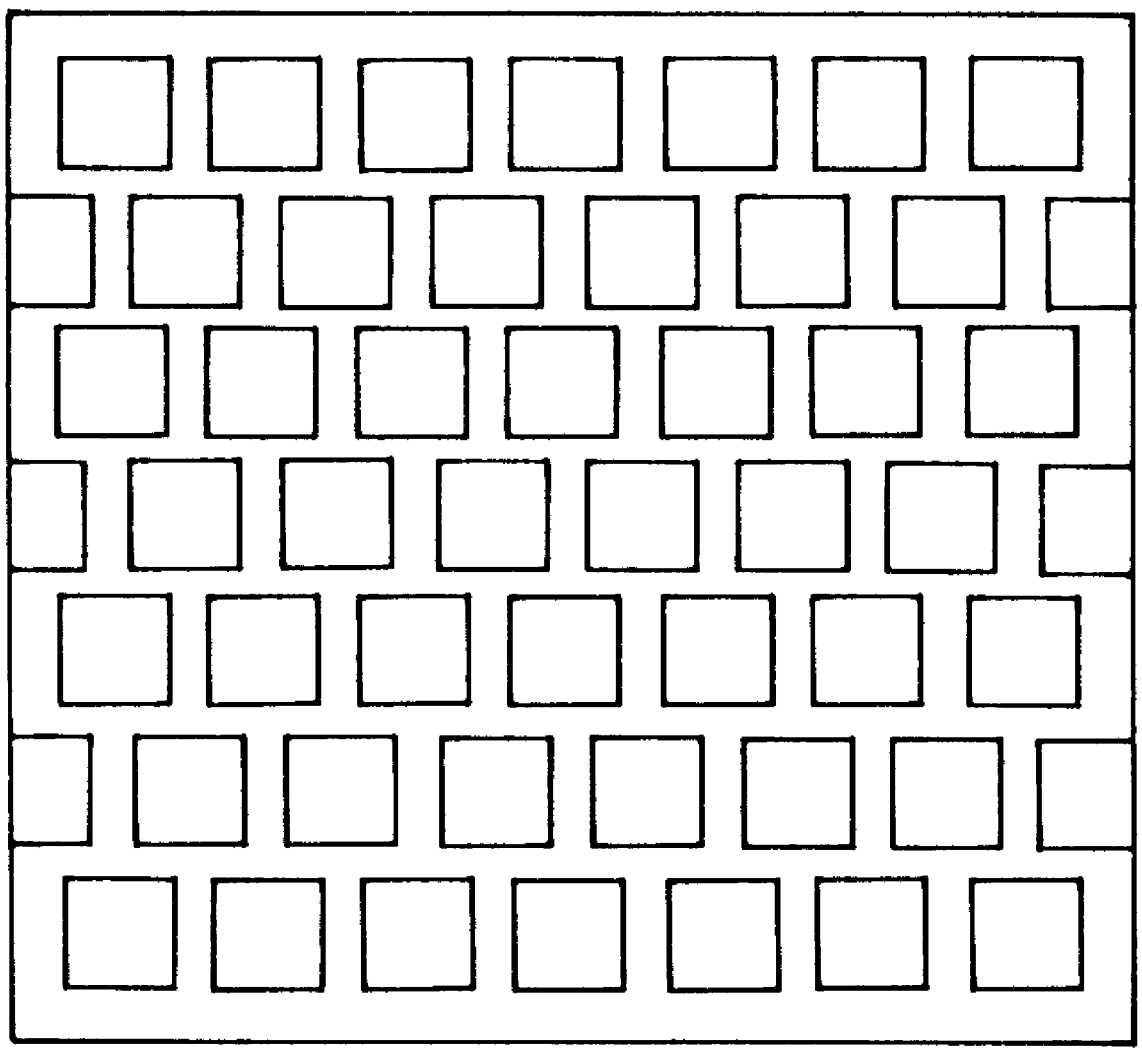
FIG. 3 is a diagram illustrating a plasma electrode on the side confronting the surface of a medium on which a plasma polymerization film is formed, as a model for the manner of coating the surface of the electrode.

For coating the surface 9a of the plasma electrode 9 with such a coating substance, if, for example, resin is used as a polymer material, a method in which a resin sheet either in its unmodified form or in the form fabricated in a "reticular shape" as illustrated in FIG. 2 or FIG. 3 is fixed by means of an adhesive agent or adhesive tape, a method in which the surface of the electrode is coated by applying thereto an adhesive tape made of resin, or a method in which the coating on the whole surface is carried out by the technique of coating, electrodeposition, baking, immersion, or flame spraying, or masking is carried out to obtain a predetermined distribution, may be cited.

In the present invention, a knowledge has been acquired that the plasma voltage from the plasma electrode 9 (the effective voltage applied to the plasma electrode) can be increased without altering the voltage of the power source 2 by coating the surface 9a of the plasma electrode 9 with the polymer material as described above. Accordingly, the plasma voltage can be increased without forcibly raising the voltage of the power source 2 so as to prevent the occurrence of abnormal discharge. Further, the velocity of ions within the reaction chamber 3 can be increased within a range where the abnormal discharge is not generated, so as to achieve the improvement in film quality and in film forming rate.

The thickness of the coat of the polymer material which is formed as described above may be suitably determined within a range in which the occurrence of abnormal discharge can be avoided and a film excellent in quality can be obtained, while paying consideration to the quality of material to be used. Preferably, the thickness is in the range of 80 $\mu$m–5 mm, preferably 120 $\mu$m–3 mm.

In the present invention, it is sufficient to produce a magnetic recording medium by using the plasma polymerization film forming apparatus 1 provided with the plasma electrode coated with the specific material at the specific ratio as described above and forming the plasma polymerization film on the ferromagnetic metal thin film by properly controlling the plasma electrode, the monomer gas flow rate and the applied voltage.

Hereinbelow, a concrete method of producing the magnetic recording medium will be described.

The method of producing the magnetic recording medium by the use of the apparatus illustrated in FIG. 1 is implemented by causing the laminated tape having the ferromagnetic metal thin film formed on the nonmagnetic substrate to be continuously conveyed in a state in which the reverse surface side of the nonmagnetic substrate contacts at least a part of the rotary drum, and meanwhile forming the plasma polymerization film on the ferromagnetic metal thin film.

Figure 5:
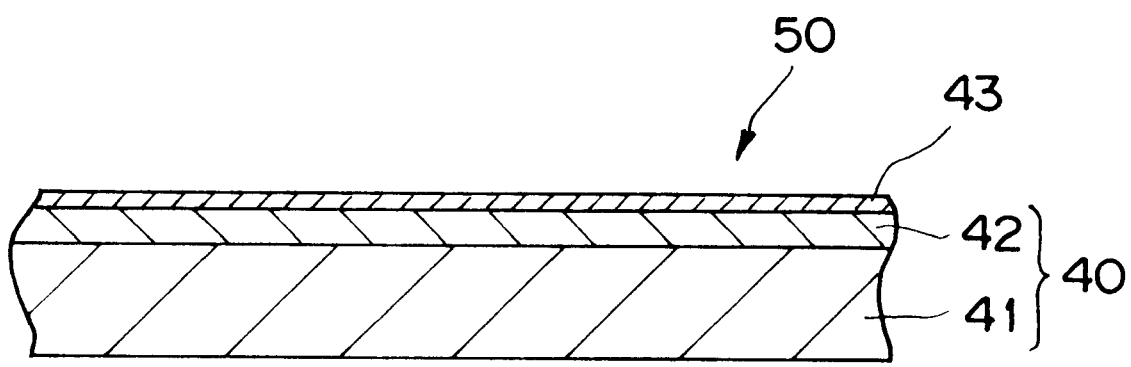
FIG. 5 is a sectional view illustrating the laminated structure of a magnetic recording medium.

FIG. 5 is a sectional view showing a magnetic recording medium 50 produced by forming a plasma polymerization film 43 on the laminated tape 40 (on the ferromagnetic metal thin film 42).

The formation of the plasma polymerization film 43 is accomplished by transforming into plasma the monomer gas of an organic compound, such as a hydrocarbon compound, by means of the high frequency in a vacuum cell and allowing the plasma to be deposited on the surface of the ferromagnetic metal thin film 42. Normally, the plasma polymerization film 43 is formed on the ferromagnetic metal thin film 42 by evacuating the inside of the vacuum cell (in the outer vacuum cell 7 and the reaction chamber 3) in which the laminated tape 40 is conveyed, to $10^{-6}$–$10^{-1}$ Torr, preferably $10^{-5}$–$10^{-4}$ Torr (ultimate pressure) (changing to a desired film quality), subsequently introducing the monomer gas or the mixed gas of monomer gas with a carrier gas as the feed gas at a predetermined flow rate into the reaction chamber 3 and meanwhile setting the power source 2 in operation, and applying the electric power of a predetermined frequency (alternatively a direct current) to the foregoing plasma electrode 9 with a predetermined voltage thereby inducing discharge and consequently bringing about such a reaction of plasma polymerization as is illustrated in FIG. 5. The operating pressure during the generation of plasma is set in the range of $10^{-3}$–1 Torr, preferably 0.1–0.2 Torr. If the operating pressure is less than $10^{-3}$ Torr, the disadvantage that the rate of film formation is extremely lowered is brought about because the plasma is not stably formed and the reaction gas is decreased. On the other hand, if the operating pressure exceeds 1 Torr, the plasma does not arise uniformly. Further, the disadvantage is caused that the high voltage is required and thus the large current flows to locally perforate the film. Further, since the amount of the reaction gas becomes excessive relative to the electric power to be introduced, the produced plasma polymerization film will suffer a decline in the hardness and a degradation of the tape characteristics such as the still.

During the formation of the plasma film, the plasma electrode 9 is provided with the given coating as described above. If this coating is absent, the disadvantage is caused that abnormal discharge is generated during the formation of the film, thereby failing to stabilize the production and suffering a decline of the yield of products. The surface area of the plasma electrode 9 may be suitably selected, depending on the scale of the equipment.

In the present invention, it is preferable that the plasma voltage during the formation of the plasma film (on the condition that the plasma electrode 9 is furnished with the given coating) is set to a level in the range of 300–1000 V.

The monomer gas to be introduced as the feed gas for the formation of the plasma polymerization film does not need to be particularly restricted but may be any of the monomer gases which are in popular use. On the other hand, a hydrocarbon gas is preferably used particularly for the purpose of forming a protective film with high durability.

As the hydrocarbon gas, methane, ethane, propane, butane, ethylene, propylene, acetylene, methyl acetylene and toluene, for example, may be used either singly or in combination thereof. Among them, ethane, propane or propylene is used as the particularly preferable hydrocarbon gas.

Control of the film quality can be realized by incorporating in the feed gas a prescribed amount of such an inert gas as argon or oxygen.

In case of the magnetic recording medium, the thickness of the plasma polymerization film to be formed as described above is suitably selected in a range such that the film manifests a fully satisfactory protective function and entails no excessive spacing loss.

The nonmagnetic substrate 41 forming the magnetic recording medium 50 has only to offer necessary resistance to heat during the formation of the ferromagnetic metal thin film 42. For example, polyethylene terephthalate (PET), polyethylene naphthalate (PEN), polyimide, polyamide, polyether ether ketone (PEEK) and polysulfones may be cited. The thickness of the nonmagnetic substrate 41, which may be occasionally selected as reconciled with the duration of recording adopted for the magnetic recording medium, is generally set in the range of about 4–40 $\mu$m. The nonmagnetic substrate 41 may be in any of various forms such as film, tape, sheet, disc, card and drum. It is, however, in the form of such an elongate nonmagnetic substrate as necessitates a protracted processing that allows the effect of the present invention to be manifested most.

It is preferable that the ferromagnetic metal thin film 42 to be formed on the nonmagnetic substrate 41 is made of cobalt or a cobalt alloy. As the cobalt alloy, Co—Ni, Co—Fe, Co—Ni—Cr, Co—Ni—B, Co—Cu or Co—Pt—Cr, for example, may be cited. When forming the ferromagnetic metal thin film 42 by vacuum deposition, the so-called single component vacuum deposition using one same crucible is adopted in case of the metal having a melting point close to that of Co or the so-called multi-component vacuum deposition using a plurality of crucibles is adopted in case of the alloying metal having a melting point remote from that of Co.

The step of vacuum deposition is carried out by evacuating the inside of the vacuum deposition chamber to, for example, about $10^{-6}$ Torr, then melting the metal for vacuum deposition with an electron gun, and starting the vacuum deposition at the time that the metal is wholly melted. Further, for the purpose of controlling the magnetic properties of the ferromagnetic metal thin film 42 to be formed by the vacuum deposition, it is generally preferable to introduce an oxidizing gas such as oxygen, ozone or nitrogen suboxide. The thickness of the ferromagnetic metal thin film 42 thus formed is set in the range of about 0.1–0.3 μm. Optionally, the ferromagnetic metal thin film 42 may be formed by the technique of ion plating or sputtering instead of the technique of vacuum deposition.

For the purpose of describing the formation of the plasma polymerization film 43 simply and comprehensibly, in the embodiment of the present invention, the explanation has been made to the case, wherein the laminated tape 40 having the ferromagnetic metal thin film 42 superposed on the nonmagnetic substrate 41 has been wound around the unwinding roll 21 in advance. The present invention is not limited thereto, but may be in the form of a system, wherein, as described in JP-A-4-95220, only a nonmagnetic substrate is arranged on an unwinding roll, and a ferromagnetic metal thin film and a plasma polymerization film are formed in order in the same vacuum cell.

Incidentally, in the production of the magnetic recording medium, any of various known liquid lubricant layers may be applied onto the protective film in the form of the plasma polymerization film 43, which improves the property in durability. Further, the nonmagnetic substrate 41 may be provided on the reverse surface thereof (the surface opposite to the surface on which the ferromagnetic metal thin film 42 is formed) with any of various known so-called back coat layers. The nonmagnetic substrate 41 and the ferromagnetic metal thin film 42 may be provided therebetween with any of various intermediate layers.

The plasma polymerization film forming apparatus 1 is not limited to the type illustrated in FIG. 1 but may adopt any of various types in popular use. However, for producing the magnetic recording medium in the form of a film, the type using the rotary drum 25 as shown in FIG. 1 is preferable.

In the foregoing embodiment, the explanation has been made to the case as a preferred example, wherein the plasma polymerization film 43 is formed on the ferromagnetic metal thin film 42. The formation of the plasma polymerization film 43 generally has only to be performed on an elongate substrate in the form of a film which is continuously conveyed. No particular limitation exists in construction or material of the elongate substrate.

Hereinbelow, concrete examples relating to the present invention will be shown so as to describe the present invention in more detail.

(Production of Example Samples 1–6 and Comparative Example Samples 1–5)

First, in the reaction chamber 3 (evacuated to $10^{-6}$ Torr), the nonmagnetic substrate 41 made of polyethylene terephthalate (PET), 6 μm in thickness, was continuously conveyed and meanwhile the ferromagnetic metal thin film 42 made of Co was formed on the substrate 41. Specifically, Co as the source of vacuum deposition was subjected to the oblique vacuum deposition to form the ferromagnetic metal thin film 42 of Co, 0.20 μm in thickness.

Then, using the apparatus shown in FIG. 1, a protective film formed of the plasma polymerization film 43 was formed on the foregoing ferromagnetic metal thin film 42. On the surface 9a of the plasma electrode 9 used in the apparatus, a sheet (3 mm in thickness) of polytetrafluoroethylene (PTFE) perforated in the fashion of punched metal as shown in FIG. 2 was attached with an adhesive tape of PTFE.

Ethylene was introduced at a rate of 2 cc/sec through the feed gas inlet pipe 6 and meanwhile the voltage (the power source voltage: 410 V) was applied to the plasma electrode 9 to generate plasma and form the plasma polymerization film 43 as a protective film.

In the formation of the plasma polymerization film 43, the film (laminated tape) was continuously supplied and taken up and meanwhile subjected to the plasma reaction for one hour, with the covering ratio of the coat of polytetrafluoroethylene (PTFE) on the surface of the plasma electrode 9 varied as shown in Table 1 below, to form the plasma polymerization film, 10 nm in thickness, on the ferromagnetic metal thin film 42 of Co. With respect to the pressure in the apparatus, the ultimate pressure before the start of the film formation was set to $5 \times 10^{-6}$ Torr, and the operating pressure during the course of the plasma reaction was set to 0.1 Torr. Thereafter, the back coat layer, 0.5 μm in thickness, was formed on the reverse surface side of the nonmagnetic substrate. Consequently, various magnetic recording medium samples shown in Table 1 below were produced (Example Samples 1–6 and Comparative Example Samples 1–5). The voltage of the power source 2 was fixed in all the experiments.

(Production of Example Samples 7 and 8)

In the production of the foregoing example sample 1, the material of the coat on the surface of the plasma electrode 9 was changed to polyamide (Example Sample 7) and polyether ether ketone (Example Sample 8). With the other conditions keeping the same as those for producing the foregoing example sample 1, the example samples 7 and 8 were produced.

(Production of Example Samples 9 and 10)

In the production of the foregoing example sample 1, the material of the coat on the surface of the plasma electrode 9 was changed to polyester (Example Sample 9) and methacrylic resin (Example Sample 10). The thickness of the coat was set to 140 μm for each and the coat was formed by painting for each. With the other conditions keeping the same as those for producing the foregoing example sample 1, the example samples 9 and 10 were produced.

(Production of Comparative Example Samples 6 and 7)

In the production of the foregoing comparative example sample 2 (covering ratio 30%) and comparative example sample 3 (covering ratio 20%), the voltage of the power source 2 was increased. With the other conditions keeping the same as those for producing the foregoing comparative example sample 2 and comparative example sample 3, the comparative example sample 6 and the comparative example sample 7 were produced, respectively.

(Production of Example Samples 11–18)

In the production of the foregoing example sample 1, the example samples 11–18 were produced by variously changing the ultimate pressure and the operating pressure as shown in Table 1 below. In the example sample 16, the feed gas was changed to acetylene.

(Production of Comparative Example Samples 8 and 9)

In the production of the foregoing example sample 1, the comparative example samples 8 and 9 were produced by changing the ultimate pressure and the operating pressure as shown in Table 1 below.

(Production of Comparative Example Sample 10)

In the production of the foregoing example sample 1, the comparative example sample 10 was produced by coating the surface of the rotary drum 25 (also called a cooling drum) with PTFE of 3 m in thickness and changing the ultimate pressure and the operating pressure as shown in Table 1 below.

medium samples were not applied with lubricant and, therefore, it was the measurement under very harsh conditions.

The results are shown in Table 1 below. The plasma voltages Vp shown in Table 1 are the effective voltages applied to the plasma electrode and represent values actually measured during the course of production.

TABLE 1

| Sample No. | Covering ratio (%) | Ultimate Pressure (Torr) | Operating pressure (Torr) | Plasma voltage Vp(Volt) | Abnormal Discharge (Number of times) | Still life (Minute) |
|---|---|---|---|---|---|---|
| Example 1 | 100 | $5 \times 10^{-5}$ | 0.1 | 456 | 0 | 455 |
| Example 2 | 90 | $5 \times 10^{-5}$ | 0.1 | 453 | 0 | 450 |
| Example 3 | 80 | $5 \times 10^{-5}$ | 0.1 | 450 | 0 | 435 |
| Example 4 | 70 | $5 \times 10^{-5}$ | 0.1 | 445 | 0 | 420 |
| Example 5 | 60 | $5 \times 10^{-5}$ | 0.1 | 435 | 0 | 320 |
| Example 6 | 50 | $5 \times 10^{-5}$ | 6.1 | 420 | 0 | 300 |
| Comparative example 1 | 40 | $5 \times 10^{-5}$ | 0.1 | 405 | 3 | 130 |
| Comparative example 2 | 30 | $5 \times 10^{-5}$ | 0.1 | 387 | 5 | 90 |
| Comparative example 3 | 20 | $5 \times 10^{-5}$ | 0.1 | 383 | 8 | 75 |
| Comparative example 4 | 10 | $5 \times 10^{-5}$ | 0.1 | 378 | 10 | 50 |
| Comparative example 5 | 0 | $5 \times 10^{-5}$ | 0.1 | 375 | 15 | 40 |
| Example 7 | 100 | $5 \times 10^{-5}$ | 0.1 | 450 | 0 | 435 |
| Example 8 | 100 | $5 \times 10^{-5}$ | 0.1 | 455 | 0 | 450 |
| Example 9 | 100 | $5 \times 10^{-5}$ | 0.1 | 470 | 0 | 455 |
| Example 10 | 100 | $5 \times 10^{-5}$ | 0.1 | 460 | 0 | 455 |
| Comparative example 6 | 30 | $5 \times 10^{-5}$ | 0.1 | 430 | 5 | 320 |
| Comparative example 7 | 20 | $5 \times 10^{-5}$ | 0.1 | 430 | 10 | 300 |
| Example 11 | 100 | $5 \times 10^{-6}$ | 0.1 | 456 | 0 | 450 |
| Example 12 | 100 | $5 \times 10^{-4}$ | 0.1 | 456 | 0 | 435 |
| Example 13 | 100 | $5 \times 10^{-2}$ | 0.1 | 456 | 0 | 430 |
| Example 14 | 100 | 0.1 | 0.1 | 456 | 0 | 420 |
| Example 15 | 100 | $5 \times 10^{-5}$ | 0.1 | 550 | 0 | 480 |
| Example 16 | 100 | $5 \times 10^{-5}$ | 0.1 | 456 | 0 | 460 |
| Example 17 | 100 | $5 \times 10^{-5}$ | $10^{-3}$ | 780 | 0 | 390 |
| Example 18 | 100 | $5 \times 10^{-5}$ | $10^{-2}$ | 652 | 0 | 415 |
| Comparative example 8 | 100 | 1 | 1.5 | 380 | 0 | 5 |
| Comparative example 9 | 100 | $5 \times 10^{-5}$ | $10^{-4}$ | 1500 | 35 | 10 |
| Comparative example 10 | 100 | $5 \times 10^{-5}$ | 0.1 | 456 | 2 | 100 |

The medium samples, that is, the example samples 1–18 and the comparative example samples 1–10 produced as described above, were evaluated during and after the production thereof as follows.

Frequency (Number of Times) of Abnormal Discharge

During one hour of the plasma polymerization, the current and the voltage between the plasma electrode and the rotary drum were monitored using Digital Oscilloscope 9400 produced by Lecroy Corporation so as to count the number of times when the current and the voltage showed abnormal values instantaneously as the frequency of abnormal discharge.

Still Life

A strip, 6.35 mm in width, was cut from each of the medium samples and operated under the conditions of 20° C. and 60% RH to record a signal of 7 MHz with the aid of a DVC-VTR (produced by Sony Corporation: VX-700). During the subsequent reproduction thereof, the time (minute) required for the output in the still mode to show a drop of 1 dB from the initial value was measured. The measured The effect of the present invention is evident from the foregoing results. Specifically, the present invention manifests a highly excellent effect of allowing the plasma polymerization film to be formed stably for a long time while very rarely suffering occurrence of abnormal discharge during the formation of the plasma polymerization film and promoting the improvement of the yield of products because it adopts as the electrode for implementing plasma polymerization that of the electrodes which is located on the side confronting a surface on which the plasma polymerization film is formed, coats this electrode with a polymer material at a covering ratio in the range of 50–100%, and effects the formation of the plasma polymerization film on an elongate substrate under the operating pressure in the range of $10^{-3}$–1 Torr. Further, the properties of the plasma polymerization film also become highly excellent.

Industrial Applicability

The present invention can be suitably utilized in industry for forming a surface protective film of a magnetic recording medium provided with a ferromagnetic metal thin film, like the so-called vacuum deposition tape, formed by the technique of, for example, oblique vacuum deposition or vertical vacuum deposition.

We claim:

1. A plasma polymerization film forming method for forming a plasma polymerization film on an elongate substrate in the form of a film while continuously conveying said elongate substrate, said method characterized by:

using an electrode for implementing plasma polymerization as one of electrodes which is located on the side confronting a surface on which the plasma polymerization film is formed, and is coated with a polymer material at a covering ratio in the range of 50–100%; and introducing a feed gas and meanwhile applying voltage to said coated electrode, and forming the plasma polymerization film on said elongate substrate under an operating pressure in the range of $10^{-3}$–1 Torr.

2. A plasma polymerization film forming method as set forth in claim 1, wherein said elongate substrate is a laminated tape having a ferromagnetic metal thin film formed on a nonmagnetic substrate, and wherein the plasma polymerization film is formed on said ferromagnetic metal thin film.

3. A plasma polymerization film forming method as set forth in claim 1, wherein the plasma polymerization film is formed on said ferromagnetic metal thin film while continuously conveying said laminated tape having the ferromagnetic metal thin film formed on the nonmagnetic substrate, in a state where the reverse surface side of said nonmagnetic substrate is in contact with at least a part of a rotary drum.

4. A plasma polymerization film forming method as set forth in claim 1, wherein said feed gas is a hydrocarbon monomer gas.

5. A plasma polymerization film forming method as set forth in claim 1, wherein the plasma voltage during the formation of the plasma film is in the range of 300–1000 V.

6. A plasma polymerization film forming apparatus for forming a plasma polymerization film on an elongate substrate in the form of a film while continuously conveying said elongate substrate, said apparatus characterized by comprising:

an electrode, as an electrode for implementing plasma polymerization, which is located on the side confronting a surface on which the plasma polymerization film is formed, wherein said electrode is coated on a surface thereof on the confronting side with a polymer material at a covering ratio in the range of 50–100%.

7. A plasma polymerization film forming apparatus as set forth in claim 6, wherein a plasma treatment object is a laminated tape having a ferromagnetic metal thin film formed on a nonmagnetic substrate, and wherein a rotary drum is provided for continuous conveyance while being in contact with the reverse surface side of the nonmagnetic substrate, and said electrode coated with the polymer material is arranged so as to confront said rotary drum.

* * * * *